(12) United States Patent
Chatterjee

(10) Patent No.: US 6,482,724 B1
(45) Date of Patent: Nov. 19, 2002

(54) INTEGRATED CIRCUIT ASYMMETRIC TRANSISTORS

(75) Inventor: Amitava Chatterjee, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 77 days.

(21) Appl. No.: 09/652,900

(22) Filed: Aug. 31, 2000

Related U.S. Application Data
(60) Provisional application No. 60/152,710, filed on Sep. 7, 1999.

(51) Int. Cl.$^7$ ............................................. H01L 21/425
(52) U.S. Cl. .................. 438/525; 438/525; 438/174; 438/179; 438/183; 438/217; 438/286; 438/289; 257/336; 257/244; 257/402; 257/403; 257/408
(58) Field of Search ................................ 428/525, 519, 428/172–179, 183–185, 212, 217, 286–89; 257/402–408, 328, 336, 344

(56) References Cited

U.S. PATENT DOCUMENTS

| | | | | |
|---|---|---|---|---|
| 5,155,369 A | * | 10/1992 | Current ................... 250/492.2 |
| 5,168,072 A | * | 12/1992 | Moslehi ........................ 437/41 |
| 5,830,788 A | * | 11/1998 | Hiroki et al. ................ 438/199 |
| 5,882,961 A | * | 3/1999 | Klingbeil, Jr. et al. ...... 438/180 |
| 5,891,782 A | * | 4/1999 | Hsu et al. .................... 438/302 |
| 5,949,105 A | * | 9/1999 | Moslehi ....................... 257/336 |
| 5,960,291 A | * | 9/1999 | Krivokapic ................. 438/286 |
| 6,008,094 A | * | 12/1999 | Krivokapic et al. ......... 438/286 |
| 6,030,875 A | * | 2/2000 | May et al. ................... 438/302 |
| 6,083,794 A | * | 4/2000 | Hook et al. ................. 438/286 |
| 6,078,071 A | * | 6/2000 | Matsuda ...................... 257/280 |
| 6,093,610 A | * | 7/2000 | Rodder ....................... 438/289 |
| 6,107,129 A | * | 8/2000 | Gardner et al. ............. 438/230 |
| 6,127,232 A | * | 10/2000 | Chatterjee et al. .......... 438/291 |
| 6,127,233 A | * | 10/2000 | Rodder ....................... 438/300 |
| 6,130,134 A | * | 10/2000 | Chen .......................... 438/302 |
| 6,211,011 B1 | * | 4/2001 | Chen .......................... 438/257 |
| 6,232,188 B1 | * | 5/2001 | Murtaza et al. ............. 438/300 |
| 6,246,091 B1 | * | 6/2001 | Rodder ....................... 257/335 |
| 6,255,174 B1 | * | 7/2001 | Yu .............................. 438/286 |
| 6,268,640 B1 | * | 7/2001 | Park et al. .................. 257/607 |
| 6,278,164 B1 | * | 8/2001 | Hieda et al. ................. 257/410 |
| 6,291,325 B1 | * | 9/2001 | Hsu ............................ 438/525 |
| 6,306,712 B1 | * | 10/2001 | Rodder et al. .............. 438/289 |

FOREIGN PATENT DOCUMENTS

EP  0763855 A2 * 12/1996 ........... H01L/29/78

OTHER PUBLICATIONS

Odanaka et al. "Potential design and transport property of 0.1 micron Mosfet with asymmetric channel profile" IEEE transactions of Electron devices vol. 44 No. 4 Apr. 1997 p. 595–600.*

Buti et al. "A new asymmetrical halo source/drain deep sub–half–micrometer n–mosfet design for reliablity and performance" IEEE transaction on electron devices vol. 38 No. 8 Aug. 1991 p. 1757–1764.*

Horiuchi et al. "An asymmetric sidewall process for high performance Idd mosfet's" IEEE transactions on electron devices vol. 41 No. 2 Feb. 1994 p. 186–190.*

* cited by examiner

*Primary Examiner*—Matthew Smith
*Assistant Examiner*—Granvill D. Lee, Jr.
(74) *Attorney, Agent, or Firm*—Peter K. McLarty; W. James Brady, III; Frederick J. Telecky, Jr.

(57) ABSTRACT

A method to form asymmetric MOS transistors using a replacement gate design. The method involves forming implanted regions (140) and (145) in the channel region after removal of the replacement gate structure (110) to produce high threshold voltage regions and low threshold voltage regions.

22 Claims, 4 Drawing Sheets

INTEGRATED CIRCUIT ASYMMETRIC TRANSISTORS

CROSS-REFERENCE TO RELATED PATENT/PATENT APPLICATIONS

This application claims the benefit of provisional application No. 60/152,710 filed Sep. 7, 1999. The following co-assigned pending patent applications are hereby incorporated by reference:

| Pat. No./Ser. No. | Filing Date | TI Case Number | Inventors |
| --- | --- | --- | --- |
| 08/957,503 | Oct. 24, 1997 | TI-22748 | Rodder et al. |
| | | TI-22027 | Rodder et al. |
| 60/126,830 | Mar. 30, 1999 | TI-23226 | Chapman |

FIELD OF THE INVENTION

The invention is generally related to the field of MOSFET transistors and more specifically to forming an asymmetric MOSFET structure using a disposable gate process.

BACKGROUND OF THE INVENTION

As CMOS technology continues to scale further into the sub-micron region, it becomes increasingly difficult to achieve a high transistor on current $I_{on}$ with a low transistor off current $I_{off}$. One way to achieve this performance is to use an idealized MOS transistor structure. In such a structure, the channel of the MOS transistor has a high threshold voltage region and a low threshold voltage region. This can be achieved by preferential channel doping. Such a MOS transistor would have an asymmetric channel doping profile where the channel would be doped such that the threshold voltage VT at the drain side (i.e., adjacent to the drain region) would be low (eg. <0) whereas at the source side (i.e., adjacent to the source region) the threshold voltage would be high enough to suppress transistor Ioff when the transistor is biased off.

Using conventional MOSFET fabrication methods, asymmetric MOSFETs have been formed using angled pocket implants as shown in FIG. 1 and angled source drain implants as shown in FIG. 2. A asymmetric MOSFET transistor according to the prior art is shown in FIG. 1. The transistor is formed in a silicon substrate 10 and comprises source/drain extensions 50 formed using the sidewall spacers 40. The source/drain extensions 50 are self-aligned to the source and drain regions 60 of the MOSFET. A gate dielectric 20 separates the gate electrode 20 from the channel region in the substrate 10. The film 25 is a dielectric film that is formed on the silicon substrate 10 but in not under the gate electrode. As shown in FIG. 1, an angled pocket implant 95 is performed to form the asymmetric regions 96 around the transistor source and drain regions 60. This angled implant 95 can be performed before or after the sidewall 40 formation. As shown in FIG. 2, angled source drain implants 102 will result in asymmetric source and drain regions 62 which will form an asymmetric transistor. In either case, in order to alter the doping close to the silicon surface under the gate, the dopants are also placed deep into the substrate beneath the gate where they compromise transistor performance. In particular, it becomes difficult to achieve a very low threshold voltage on the drain side of the channel without simultaneously causing large short channel effects which are undesirable. In fabricating asymmetric transistors it is desirable to achieve low threshold voltage using a relatively abrupt lightly doped or compensated region near the channel surface beneath the gate of the transistor.

SUMMARY OF THE INVENTION

This invention is a method for fabricating an asymmetric transistor. In an embodiment of the instant invention, the method comprises: providing a silicon substrate with a region of a first conductivity type; forming an insulator layer over said substrate; forming a disposable gate over said insulator layer over said substrate region of said first conductivity type; forming a plurality of sidewall structures adjacent to said disposable gate; forming source and drain regions adjacent to said sidewall structures; forming an insulator layer over said source and drain regions; removing said disposable gate to form a gap between said plurality of sidewall structures without substantially removing any other exposed material; implanting a first dopant species of a first conductivity type into said gap to form a high threshold voltage region; removing said insulator layer in said gap exposing a portion of said silicon substrate; forming a gate dielectric over said exposed portion of said silicon substrate; and forming a gate electrode over said gate dielectric.

In another embodiment of the instant invention, the method comprises: providing a silicon substrate with a region of a first conductivity type; forming an insulator layer over said substrate; forming a disposable gate over said insulator layer over said substrate region of said first conductivity type; forming a plurality of sidewall structures adjacent to said disposable gate; forming source and drain regions adjacent to said sidewall structures; forming an insulator layer over said source and drain regions; removing said disposable gate to form a gap between said plurality of sidewall structures without substantially removing any other exposed material; implanting a second dopant species of a second conductivity type into said gap to form a low threshold voltage region; removing said insulator layer in said gap exposing a portion of said silicon substrate; forming a gate dielectric over said exposed portion of said silicon substrate; and forming a gate electrode over said gate dielectric.

In another embodiment, the method comprises: providing a silicon substrate with a region of a first conductivity type; forming an insulator layer over said substrate; forming a disposable gate over said insulator layer over said substrate region of said first conductivity type; forming a plurality of sidewall structures adjacent to said disposable gate; forming source and drain regions adjacent to said sidewall structures; forming an insulator layer over said source and drain regions; removing said disposable gate to form a gap between said plurality of sidewall structures without substantially removing any other exposed material; implanting a first dopant species of a first conductivity type into said gap to form a high threshold voltage region; implanting a second dopant species of a second conductivity type into said gap to form a low threshold voltage region; removing said insulator layer in said gap exposing a portion of said silicon substrate; forming a gate dielectric over said exposed portion of said silicon substrate; and forming a gate electrode over said gate dielectric.

One advantage of the above described method is the forming of an asymmetric transistor without a degradation in transistor performance. This and other technical advantages of the instant invention will be readily apparent to one skilled in the art from the following FIGUREs, description, and claims.

BRIEF DESCRIPTION OF THE DRAWINGS

In the drawings.

Corresponding numerals and symbols in the different figures refer to corresponding parts unless otherwise indicated.

DETAILED DESCRIPTION OF THE INVENTION

The invention will now be described in conjunction with a replacement gate MOSFET transistor. It will be apparent to those of ordinary skill in the art that the benefits of the invention can be applied to other transistor types.

An embodiment of the instant invention illustrating the fabrication of an asymmetric transistor with near ideal properties is shown in FIGS. 3 and 4. Shown in FIG. 3A is a semiconductor substrate 15 on which a dummy insulator layer 105 has been formed. The semiconductor substrate 15 can comprise a bulk substrate or an eptaxial layer. In addition to being a bulk substrate or an eptaxial layer, the region shown in FIG. 3A could comprise a n-well region or a p-well region in the substrate 15. The dummy layer 105 is formed on all exposed silicon surfaces and could comprise a silicon dioxide, silicon nitride, or a silicon oxynitride film. A disposable gate layer is formed, patterned and etched resulting in structure 110 shown in FIG. 3A. The disposable gate structure 110 could be comprised of polysilicon, amorphous silicon, or crystalline silicon. Following the formation of the disposable gate structure, the source and drain extension regions 115 are formed by ion implantation. For a n-type substrate 15 beneath the disposable gate structure 110, p-type dopant species such as a boron containing ion species is used. For a p-type substrate 15 beneath the disposable gate structure 110, n-type dopant species such as arsenic, phosphorous, a combination of both, or any suitable n-type dopant ion species is used. In some instances in may be necessary to form pocket regions to suppress short channel effects. Pocket regions can be formed by implanting n-type or p-type dopant species as necessary. The formation of pocket regions is well known in the art.

Figure 3A:
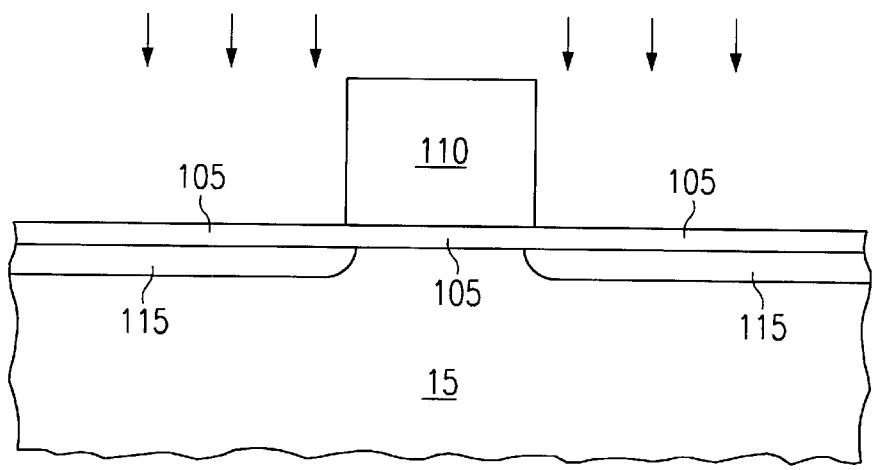
FIGS. 3A–3D are cross-sectional diagrams of partially fabricated transistors in a replacement gate process.
Figure 3B:
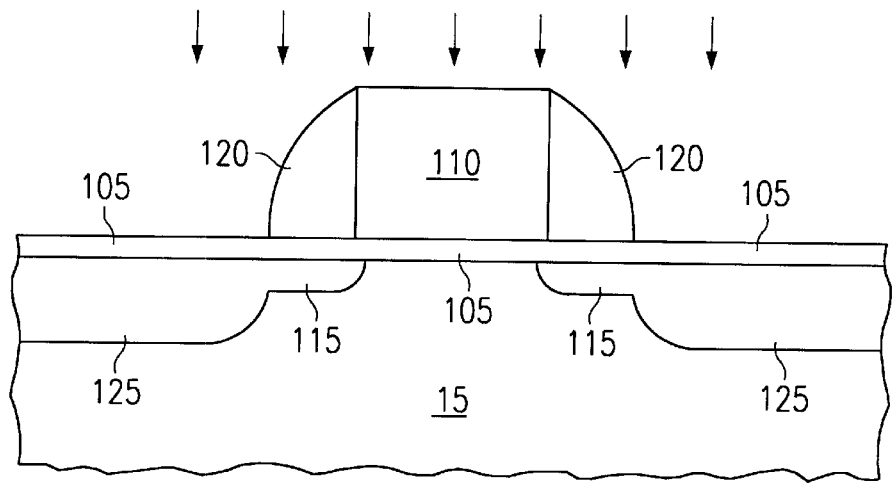

Following the formation of the source drain extension regions 115, sidewall structures 120 are formed as illustrated in FIG. 3B. In an embodiment of the instant invention these sidewall structures can be formed with silicon nitride using a blanket film formation followed by an anisotropic silicon nitride etch. Such a process is well known in the art. Following the formation of the sidewall structures 120, the source region and drain region 125 are formed using ion implantation. For a n-type substrate 15 beneath the disposable gate structure 110, p-type dopant species such as a boron containing ion species is used to form the source drain region 125. For a p-type substrate 15 beneath the disposable gate structure 110, n-type dopant species such as arsenic, phosphorous, a combination of both, or any suitable n-type dopant ion species is used to form regions 125. Following formation of the source drain regions 125 and the drain and source extension regions 115 a thermal annealing process is performed to thermally activate the implanted dopants. If it is necessary to form a silicide film on the source and drain junction regions 125, it should preferably be performed after the anneal of the source and drain implanted regions 125.

Figure 3C:
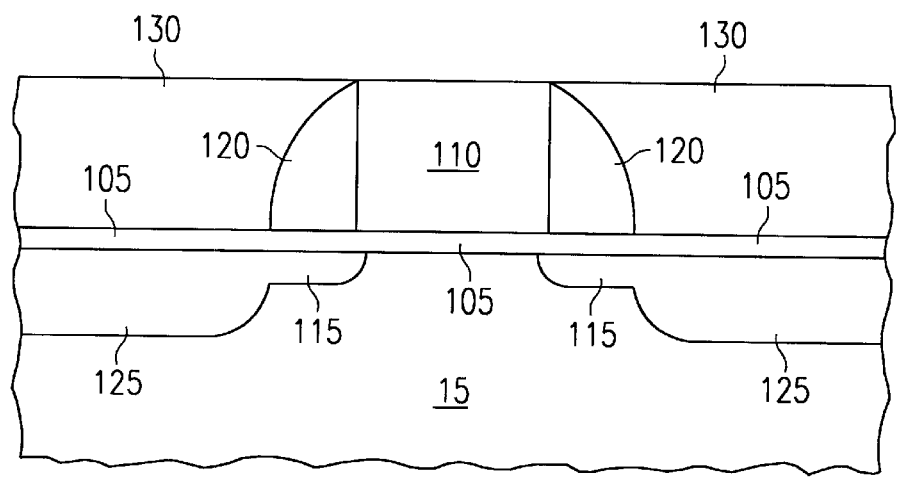
Figure 3D:
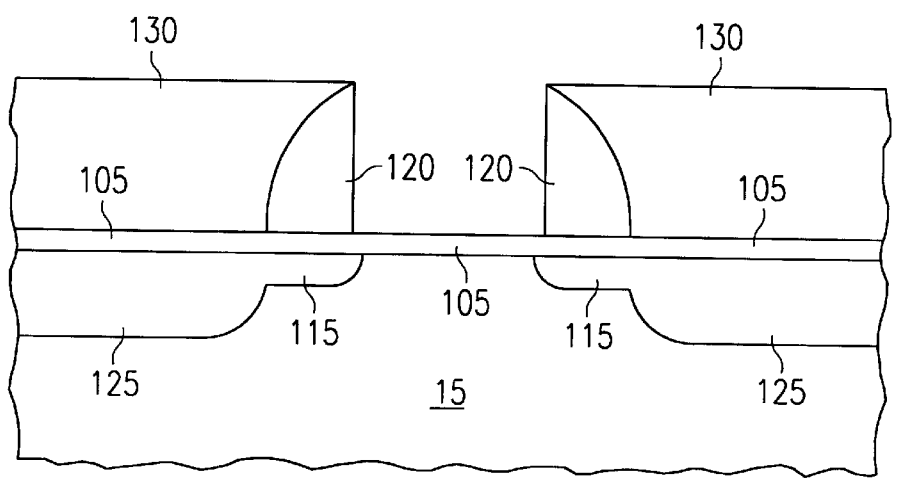

Following the thermal annealing process, an insulator layer is deposited and planarized to form the structure 130 shown in FIG. 3C. The insulator layer could be a chemical vapor deposited (CVD) silicon oxide, PECVD TEOS, HDP Oxide, or any insulating material with similar properties. The planarization of the insulator layer could be performed using chemical mechanical polishing or plasma etching and should uncover the top surface of the disposable gate structure 110. As shown in FIG. 3D, A preferential etch is performed to remove the disposable gate layer 110 without attacking the sidewall structure 120. Removing the disposable gate structure 110 forms a gap between the sidewall structures 120 into which dopant species will be implanted to form the asymmetric transistor. The etch should preferentially etch the disposable gate structure 110 without attacking any other exposed surface, substrate or sidewall structures 120. For the embodiment where the disposable gate 110 is formed from single crystal silicon, polysilicon, or amorphous silicon and the sidewall structures 120 from silicon nitride, a chlorine based etched is used to remove the disposable gate structures 110. This etch will not react with silicon oxide or silicon nitride.

Figure 1:
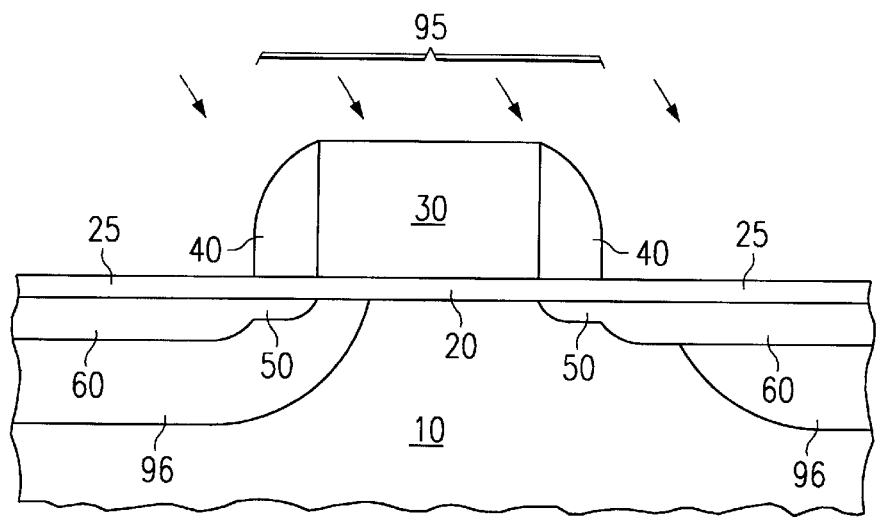
FIG. 1 is a cross-sectional diagram of an asymmetric transistor formed by angled pocket implants according to the prior art.
Figure 2:
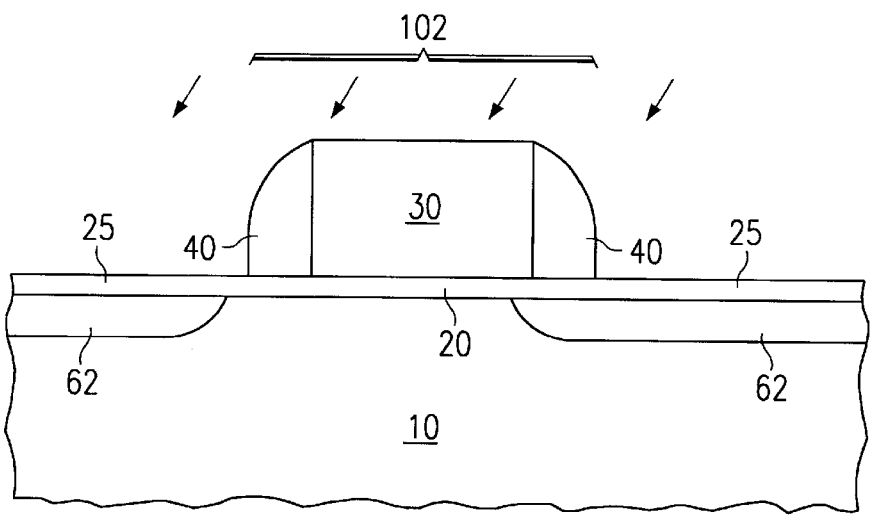
FIG. 2 is a cross-sectional diagram of an asymmetric transistor formed by angled source drain implants according to the prior art.
Figure 4A:
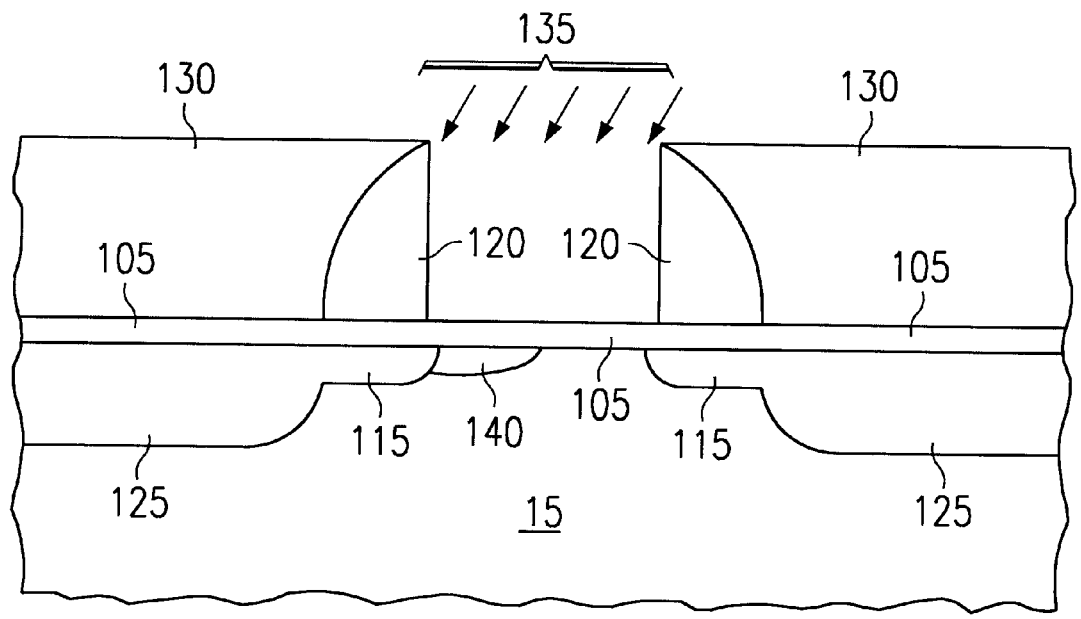
FIGS. 4A–4D are cross-sectional diagrams showing embodiments of the instant invention.

An embodiment of the instant invention is shown in FIG. 4A. Following the removal of the gate structure 110, an angled implant is performed to form region 140. For a p-type substrate beneath region 135, p-type dopant species such as a boron containing ion species is used to form region 140. For a n-type substrate beneath region 135, n-type dopant species such as arsenic, phosphorous, a combination of both, or any suitable n-type dopant ion species is used to form region 140. This implanted region forms the high threshold voltage region of the asymmetric transistor corresponding to schematic transistor 90 in FIG. 2 by forming a shallow surface region 140 of increased channel doping concentration. From FIG. 4A it is observed that the region 140 of increased channel doping concentration does not extend over the entire gap but is localized adjacent to one of the extension regions 115.

Figure 4B:
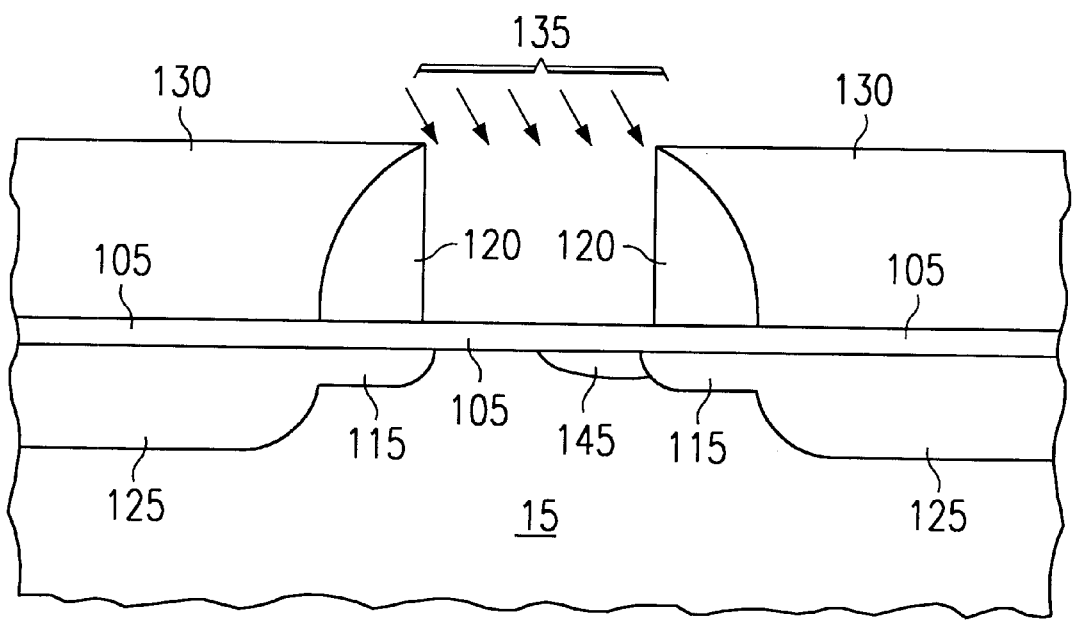

A further embodiment of the instant invention is shown in FIG. 4B. Following the removal of the gate structure 110, an angled implant is performed to form region 145. For a n-type substrate beneath region 135, p-type dopant species such as a boron containing ion species is used to form region 145. For a p-type substrate beneath region 135, n-type dopant species such as arsenic, phosphorous, a combination of both, or any suitable n-type dopant ion species is used to form region 145. This implanted region forms the low threshold voltage region of the asymmetric transistor corresponding to schematic transistor 100 in FIG. 2 by forming a shallow surface region 145 of compensated channel doping. From FIG. 4B it is observed that the region 145 of compensated channel doping concentration does not extend over the entire gap but is localized adjacent to one of the extension regions 115.

Figure 4C:
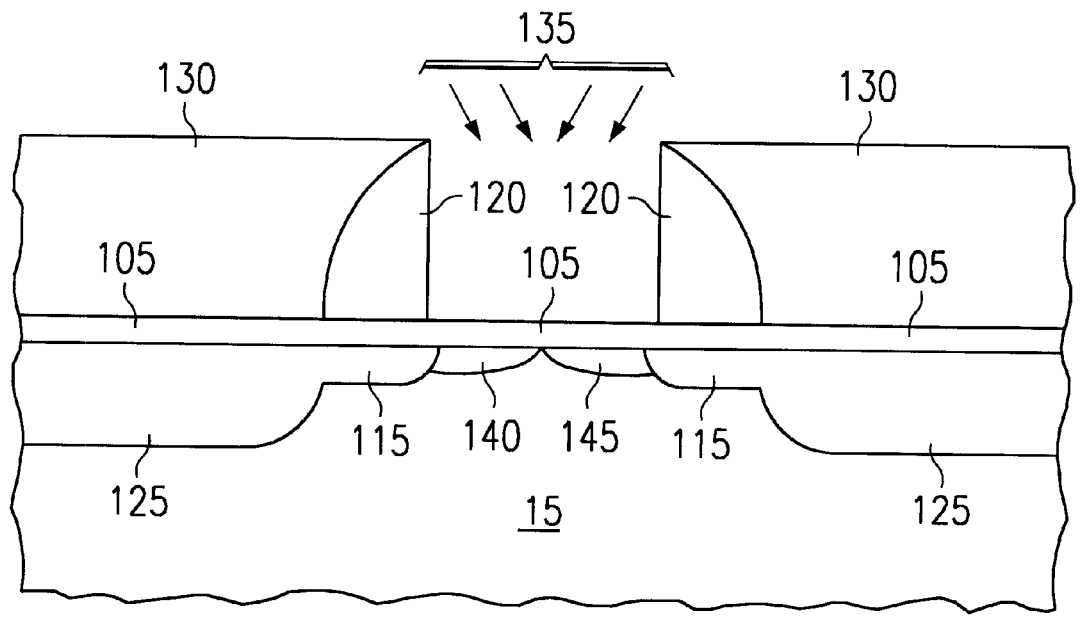

A further embodiment of the instant invention is shown in FIG. 4C. In this embodiment, both regions 140 and 145 are formed using multiple angled n-type and p-type implants of the type discussed above for the formation of each of the regions 140 and 145. In this embodiment, regions 140 and 145 will simultaneously form the high threshold voltage region and the low threshold voltage region of the asymmetric transistor respectively corresponding to schematic transistors 90 and 100 in FIG. 2 respectively. From FIG. 4C it is observed that neither region 145 of compensated channel doping concentration nor region 140 of increased channel doping concentration extend over the entire gap but each region 140 and 145 is localized adjacent to one or the other of the extension regions 115.

Figure 4D:
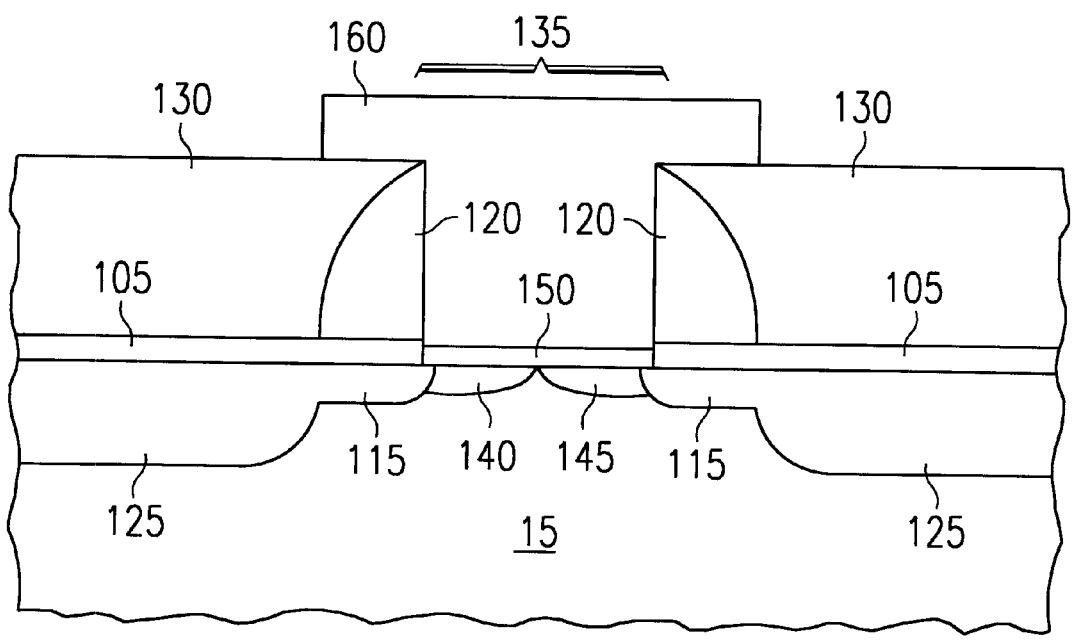

Shown in FIG. 4D is a completed asymmetric transistor according to an embodiment of the instant invention. A gate dielectric 150 is formed in the region 135 between the sidewall structures 120 as illustrated in FIG. 4D. This gate dielectric could be comprised of silicon oxide, silicon oxynitride, silicon nitride, a high-k dielectric or any combination thereof. It could also be comprised of alternating layers of silicon oxide, silicon oxynitride and silicon nitride. A replacement gate 160 layer is formed above the gate dielectric as shown in the Figure. This replacement gate 160 could be comprised of polysilicon, amorphous silicon, a combination of polygermanium and polysilicon, or a metal. If a metal is used, the preferred choices would be a metal with a work function intermediate to that for n-type and p-type silicon or with one metal having a work function similar to n-type polysilicon for NMOS devices and another metal with a work function similar to p-type polysilicon for PMOS devices. If polysilicon is used, it should be doped during deposition or formation. The most likely choices for doping would be dopants causing the polysilicon to be n-type. This would necessitate the proper design of the PMOS transistors for operation as buried channel transistors. It should be noted that although FIG. 4D shows the presence of regions 140 and 145, this is one embodiment of the instant invention. As discussed above other embodiments would be asymmetric transistors with either region 140 or region 145. Following the formation of the asymmetric transistors the integrated circuit is completed using standard processing techniques.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

I claim:

1. A method of fabricating a transistor, comprising the steps of:

providing a silicon substrate with a region of a first conductivity type;

forming an insulator layer over said substrate;

forming a disposable gate over said insulator layer over said substrate region of said first conductivity type;

forming a plurality of sidewall structures adjacent to said disposable gate;

forming source and drain regions adjacent to said sidewall structures;

forming an insulator layer over said source and drain regions;

removing said disposable gate to form a gap between said plurality of sidewall structures without substantially removing any other exposed material;

implanting a dopant species of a first conductivity type at an angle into said gap to form a localized high threshold voltage region adjacent to an extension region wherein said high threshold voltage region does not extend over the entire gap;

removing said insulator layer in said gap exposing a portion of said silicon substrate;

forming a gate dielectric over said exposed portion of said silicon substrate; and forming a gate electrode over said gate dielectric.

2. The method of claim 1 wherein said disposable gate layer comprises a material selected from the group consisting of: polysilicon, amorphous silicon, crystalline silicon and silicon nitride.

3. The method of claim 1 wherein said sidewall structure is silicon nitride.

4. The method of claim 1 wherein forming said source drain regions further comprises the steps of:

implanting a dopant species into said silicon substrate adjacent to said plurality of outer sidewall structures; and annealing said silicon substrate.

5. The method of claim 1 wherein said insulator layer comprises a material selected from the group consisting of: silicon oxide, CVD silicon oxide, PECVD TEOS, and HDP Oxide.

6. The method of claim 1 wherein said forming said gate dielectric comprises growing a dielectric film.

7. The method of claim 1 wherein said forming said gate dielectric comprises depositing a dielectric film.

8. The method of claim 1 wherein said gate dielectic comprises a material selected from the group consisting of: silicon oxide, silicon oxynitride, and silicon nitride.

9. The method of claim 1 wherein said forming said gate dielectric further comprises the steps of:

forming a gate electrode film on said gate dielectric such that the surface of said gate electrode film is above the surface of said insulator layer; and patterning and etching said gate electrode film to form said gate electrode.

10. The method of claim 1 wherein said gate electrode comprises a material selected form the group consisting of: polysilicon, amorphous silicon, polygermanium, and a metal.

11. A method of fabricating a transistor, comprising the steps of:

providing a silicon substrate with a region of a first conductivity type;

forming an insulator layer over said substrate;

forming a disposable gate over said insulator layer over said substrate region of said first conductivity type;

forming a plurality of sidewall structures adjacent to said disposable gate;

forming source and drain regions adjacent to said sidewall structures;

forming an insulator layer over said source and drain regions;

removing said disposable gate to form a gap between said plurality of sidewall structures without substantially removing any other exposed material;

implanting a dopant species of a second conductivity type at an angle into said gap to form a localized low threshold voltage region adjacent to an extension region wherein said low threshold voltage region does not extend over the entire gap;

removing said insulator layer in said gap exposing a portion of said silicon substrate;

forming a gate dielectric over said exposed portion of said silicon substrate; and forming a gate electrode over said gate dielectric.

12. The method of claim 11 wherein said disposable gate layer comprises a material selected from the group consisting of: polysilicon, amorphous silicon, crystalline silicon and silicon nitride.

13. The method of claim 11 wherein said sidewall structure is silicon nitride.

14. The method of claim 11 wherein forming said source drain regions further comprises the steps of:

implanting a dopant species into said silicon substrate adjacent to said plurality of outer sidewall structures; and annealing said silicon substrate.

15. The method of claim 11 wherein said insulator layer comprises a material selected from the group consisting of: silicon oxide, CVD silicon oxide, PECVD TEOS, and HDP Oxide.

16. The method of claim 11 wherein said forming said gate dielectric comprises growing a dielectric film.

17. The method of claim 11 wherein said forming said gate dielectric comprises depositing a dielectric film.

18. The method of claim 11 wherein said gate dielectic comprises a material selected from the group consisting of: silicon oxide, silicon oxynitride, and silicon nitride.

19. The method of claim 11 wherein said forming said gate dielectric further comprises the steps of:

forming a gate electrode film on said gate dielectric such that the surface of said gate electrode film is above the surface of said insulator layer; and patterning and etching said gate electrode film to form said gate electrode.

20. The method of claim 11 wherein said gate electrode comprises a material selected form the group consisting of: polysilicon, amorphous silicon, polygermanium, and a metal.

21. A method of fabricating a transistor, comprising the steps of:

providing a silicon substrate with a region of a first conductivity type;

forming an insulator layer over said substrate;

forming a disposable gate over said insulator layer over said substrate region of said first conductivity type;

forming a plurality of sidewall structures adjacent to said disposable gate;

forming source and drain regions adjacent to said sidewall structures;

forming an insulator layer over said source and drain regions;

removing said disposable gate to form a gap between said plurality of sidewall structures without substantially removing any other exposed material;

implanting a dopant species of a first conductivity type at an angle into said gap to form a localized high threshold voltage region adjacent to a first extension region wherein said high threshold voltage region does not extend over the entire gap;

implanting a dopant species of a second conductivity type at an angle into said gap to form a localized low threshold voltage region adjacent to a second extension region wherein said low threshold voltage region does not extend over the entire gap;

removing said insulator layer in said gap exposing a portion of said silicon substrate;

forming a gate dielectric over said exposed portion of said silicon substrate; and forming a gate electrode over said gate dielectric.

22. The method of claim 21 wherein forming said source drain regions further comprises the steps of:

implanting a dopant species into said silicon substrate adjacent to said plurality of outer sidewall structures; and annealing said silicon substrate.

* * * * *